United States Patent
Lee et al.

(10) Patent No.: US 9,607,762 B2
(45) Date of Patent: Mar. 28, 2017

(54) MULTILAYER CERAMIC ELECTRONIC PART TO BE EMBEDDED IN BOARD AND PRINTED CIRCUIT BOARD HAVING MULTILAYER CERAMIC ELECTRONIC PART EMBEDDED THEREIN

(71) Applicant: SAMSUNG ELECTRO-MECHANICS CO., LTD., Suwon, Gyunggi-do (KR)

(72) Inventors: Byoung Hwa Lee, Gyunggi-do (KR); Doo Young Kim, Gyunggi-do (KR); Hai Joon Lee, Gyunggi-do (KR); Jin Man Jung, Gyunggi-do (KR)

(73) Assignee: SAMSUNG ELECTRO-MECHANICS CO., LTD., Suwon, Gyunggi-Do (KR)

( * ) Notice: Subject to any disclaimer, the term of this patent is extended or adjusted under 35 U.S.C. 154(b) by 148 days.

(21) Appl. No.: 14/149,474

(22) Filed: Jan. 7, 2014

(65) Prior Publication Data
US 2015/0021080 A1    Jan. 22, 2015

(30) Foreign Application Priority Data
Jul. 22, 2013    (KR) .......................... 10-2013-0086325

(51) Int. Cl.
*H01G 4/005* (2006.01)
*H01G 4/30* (2006.01)
(Continued)

(52) U.S. Cl.
CPC ............... *H01G 4/005* (2013.01); *H01G 2/06* (2013.01); *H01G 4/30* (2013.01); *H05K 1/185* (2013.01);
(Continued)

(58) Field of Classification Search
CPC   H01G 4/30; H01G 4/005; H01G 2/06; H05K 1/185
See application file for complete search history.

(56) References Cited

U.S. PATENT DOCUMENTS 5,943,216 A  *  8/1999  Schmidt ....................... 361/761
6,606,237 B1    8/2003  Naito et al.
(Continued)

FOREIGN PATENT DOCUMENTS

JP            54158669 A   * 12/1979
JP            62-124835 U     8/1987
(Continued)

OTHER PUBLICATIONS

MachineTranslation of JP2011187648 which was puiblished on Sep. 22, 2011.*
(Continued)

*Primary Examiner* — David M Sinclair
(74) *Attorney, Agent, or Firm* — McDermott Will & Emery LLP

(57) ABSTRACT

There is provided a multilayer ceramic electronic part to be embedded in a board including: a ceramic body including dielectric layers; an active layer including a plurality of first and second internal electrodes; upper and lower cover layers disposed on and below the active layer, respectively; and first and second external electrodes formed on both end portions of the ceramic body, wherein a first internal electrode positioned at an outermost position among the first electrodes is connected to the first external electrode by at least one first via extended to at least one of first and second main surfaces of the ceramic body, and a second internal electrode positioned at an outermost position among the second internal electrodes is connected to the second exter- (Continued)

nal electrode by at least one second via extended to at least one of first and second main surfaces of the ceramic body.

16 Claims, 8 Drawing Sheets

(51) Int. Cl.
   *H01G 2/06* (2006.01)
   *H05K 1/18* (2006.01)
(52) U.S. Cl.
   CPC ... *H05K 2201/10636* (2013.01); *Y02P 70/611* (2015.11)

(56) References Cited

U.S. PATENT DOCUMENTS

| | | | |
|---|---|---|---|
| 8,179,660 B2 * | 5/2012 | Katsube | H01G 4/2325 361/306.1 |
| 2003/0231457 A1 * | 12/2003 | Ritter et al. | 361/306.3 |
| 2005/0248908 A1 | 11/2005 | Dreezen et al. | |
| 2007/0041146 A1 * | 2/2007 | Togashi | 361/305 |
| 2009/0002921 A1 * | 1/2009 | Ritter et al. | 361/321.3 |
| 2010/0128411 A1 | 5/2010 | Onishi et al. | |
| 2012/0018205 A1 * | 1/2012 | Sato et al. | 174/260 |
| 2012/0188682 A1 | 7/2012 | Sato et al. | |
| 2012/0300361 A1 * | 11/2012 | Togashi | 361/301.4 |

FOREIGN PATENT DOCUMENTS

| | | | |
|---|---|---|---|
| JP | 64-081306 A | | 3/1989 |
| JP | 02-128414 A | | 5/1990 |
| JP | 04259205 A | * | 9/1992 |
| JP | 08-330173 A | | 12/1996 |
| JP | 09-219335 A | | 8/1997 |
| JP | 11-135356 A | | 5/1999 |
| JP | 2003-347160 A | | 12/2003 |
| JP | 2004-259990 A | | 9/2004 |
| JP | 2005-039200 A | | 2/2005 |
| JP | 2006196818 A | * | 7/2006 |
| JP | 2009-194397 A | | 8/2009 |
| JP | 2010-129737 A | | 6/2010 |
| JP | 2010129737 A | * | 6/2010 |
| JP | 2011-108874 A | | 6/2011 |
| JP | 2011187648 A | * | 9/2011 |
| JP | 2012-164966 A | | 8/2012 |
| KR | 10-2006-0047733 | | 5/2006 |

OTHER PUBLICATIONS

Notice of Office Action Japanese Patent Application No. 2013-269713 dated May 12, 2015 with English translation.
Notice of Office Action Korean Patent Application No. 10-2013-0086325 dated Jul. 24, 2014 with English language translation.

* cited by examiner

X-X'

MULTILAYER CERAMIC ELECTRONIC PART TO BE EMBEDDED IN BOARD AND PRINTED CIRCUIT BOARD HAVING MULTILAYER CERAMIC ELECTRONIC PART EMBEDDED THEREIN

CROSS-REFERENCE TO RELATED APPLICATION

This application claims the benefit of Korean Patent Application No. 10-2013-0086325 filed on Jul. 22, 2013, with the Korean Intellectual Property Office, the disclosure of which is incorporated herein by reference.

BACKGROUND

The present disclosure relates to a multilayer ceramic electronic part to be embedded in a board and a printed circuit board having a multilayer ceramic electronic part embedded therein.

As an electronic circuit has undergone high densification and high integration, mounting areas of a printed circuit board on which passive elements can be mounted have decreased, such that an effort to achieve an embedded device, a part embedded in a board, has been conducted. In particular, various methods in which a multilayer ceramic electronic part used as a capacitive part is embedded within the substrate have been suggested.

As a method of embedding the multilayer ceramic electronic part in the board, a board material itself may be used as a dielectric material for the multilayer ceramic electronic part and a copper wiring, and the like, may be used as an electrode for the multilayer ceramic electronic part. Alternatively, a polymer sheet having a high dielectric constant or a thin film dielectric may be formed in the board to manufacture the multilayer ceramic electronic part to be embedded in the board, or the multilayer ceramic electronic part may be embedded in the board.

In general, the multilayer ceramic electronic part includes a plurality of dielectric layers formed of a ceramic material and internal electrodes inserted between the plurality of dielectric layers. The multilayer ceramic electronic part to be embedded in the board having a high capacitance may be achieved by disposing the multilayer ceramic electronic part in the board.

In order to manufacture the printed circuit board having the multilayer ceramic electronic part embedded therein, after the multilayer ceramic electronic part is inserted into a core board, laser needs to be used to drill via holes in an upper multilayer plate and a lower multilayer plate in order to connect board wirings to external electrodes of the multilayer ceramic electronic part. The laser processing is a factor significantly increasing the manufacturing cost of the printed circuit board.

Meanwhile, since the multilayer ceramic electronic part to be embedded in the board needs to be embedded in a core part in the board, the external electrode thereof does not require a nickel/tin (Ni/Sn) plating layer, unlike a general multilayer ceramic electronic part to be mounted on a surface of the board.

Since the external electrode of the multilayer ceramic electronic part to be embedded in the board is electrically connected to a circuit in the board through a via formed of a copper (Cu) material, a copper (Cu) layer is required on the external electrode instead of a nickel/tin (Ni/Sn) layer.

In general, the external electrode is mainly formed of copper (Cu), but includes glass, such that at the time of laser processing used to form the via in the substrate, an element included in the glass absorbs the laser, whereby a processing depth of the via may not be adjusted.

Due to the reason described above, the external electrode of the multilayer ceramic electronic part includes a copper (Cu) plating layer separately formed thereon.

Meanwhile, the multilayer ceramic electronic part to be embedded in the board is embedded in the printed circuit board used in a memory card, a PC main board, and various radio frequency (RF) modules, such that a size of a manufactured product may be significantly decreased as compared to when a multilayer ceramic electronic part mounted on a board is used.

In addition, since the multilayer ceramic electronic may be disposed significantly close to an input terminal of an active element such as a microprocessor unit (MPU), interconnect inductance due to a length of an electrical wire may be decreased.

A decrease in inductance of the multilayer ceramic electronic part is merely caused by the decrease in the interconnect inductance obtained due to a unique disposition relationship, that is, an embedded scheme, and equivalent series inductance (ESL) properties of the multilayer ceramic electronic part still require improvement.

In general, in the multilayer ceramic electronic part to be embedded in the board, a current path in the multilayer ceramic electronic part needs to be shortened in order to decrease the ESL.

However, the external electrode of the multilayer ceramic electronic part includes the copper (Cu) plating layer separately formed thereon, thereby causing a problem in which a plating solution infiltrates the external electrode, rendering it difficult to shorten the current path in the multilayer ceramic electronic part.

RELATED ART DOCUMENT (Patent Document 1) Korean Patent Laid-Open Publication No. 2006-0047733

SUMMARY

An aspect of the present disclosure may provide a multilayer ceramic electronic part to be embedded in a board and a printed circuit board having the multilayer ceramic electronic part embedded therein.

According to an aspect of the present disclosure, a multilayer ceramic electronic part to be embedded in a board may include: a ceramic body including dielectric layers and having first and second main surfaces opposing each other, first and second side surfaces opposing each other, and first and second end surfaces opposing each other; an active layer including a plurality of first and second internal electrodes alternately exposed through the first and second end surfaces of the ceramic body, having the dielectric layers therebetween, to thereby form capacitance; upper and lower cover layers disposed on and below the active layer, respectively; and first and second external electrodes formed on both end portions of the ceramic body, wherein the first external electrode includes a first base electrode and a first terminal electrode formed on the first base electrode, the second external electrode includes a second base electrode and a second terminal electrode formed on the second base electrode, a first internal electrode positioned at an outermost position among the first and second internal electrodes is connected to the first base electrode by at least one first via extended to at least one of the first and second main surfaces of the ceramic body, and a second internal electrode positioned at an outermost position among the first and second internal electrodes is connected to the second base electrode by at least one second via extended to at least one of the first and second main surfaces of the ceramic body.

A width of the first external electrode formed on the first and second main surfaces may be different from that of the second external electrode formed thereon.

The first and second vias may be extended to the first main surface.

The lower cover layer may be thicker than the upper cover layer.

The first via may be extended to the first main surface and the second via may be extended to the second main surface.

The first and second terminal electrodes may be formed of copper (Cu).

The first and second terminal electrodes may have a thickness of 5 μm or greater.

When a surface roughness of the first and second terminal electrodes is Ra and a thickness of the first and second terminal electrodes is tp, 200 nm≤Ra≤tp may be satisfied.

The first and second terminal electrodes may be formed by a plating process.

The ceramic body may have a thickness of 250 μm or less.

According to another aspect of the present disclosure, a printed circuit board having a multilayer ceramic electronic part embedded therein may include: an insulating substrate; and the embedded multilayer ceramic electronic component including a ceramic body including dielectric layers and having first and second main surfaces opposing each other, first and second side surfaces opposing each other, and first and second end surfaces opposing each other; an active layer including a plurality of first and second internal electrodes alternately exposed through the first and second end surfaces of the ceramic body, having the dielectric layers therebetween, to thereby form capacitance; upper and lower cover layers disposed on and below the active layer, respectively; and first and second external electrodes formed on both end portions of the ceramic body, wherein the first external electrode includes a first base electrode and a first terminal electrode formed on the first base electrode, the second external electrode includes a second base electrode and a second terminal electrode formed on the second base electrode, a first internal electrode positioned at an outermost position among the first and second internal electrodes is connected to the first base electrode by at least one first via extended to at least one of the first and second main surfaces of the ceramic body, and a second internal electrode positioned at an outermost position among the first and second internal electrodes is connected to the second base electrode by at least one second via extended to at least one of the first and second main surfaces of the ceramic body.

A width of the first external electrode formed on the first and second main surfaces may be different from that of the second external electrode formed thereon.

The first and second vias may be extended to the first main surface.

The lower cover layer may be thicker than the upper cover layer.

The first via may be extended to the first main surface and the second via may be extended to the second main surface.

The first and second terminal electrodes may be formed of copper (Cu).

The first and second terminal electrodes may have a thickness of 5 μm or greater.

When a surface roughness of the first and second terminal electrodes is Ra and a thickness of the first and second terminal electrodes is tp, 200 nm≤Ra≤tp may be satisfied.

The first and second terminal electrodes may be formed by a plating process.

The ceramic body may have a thickness of 250 μm or less.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
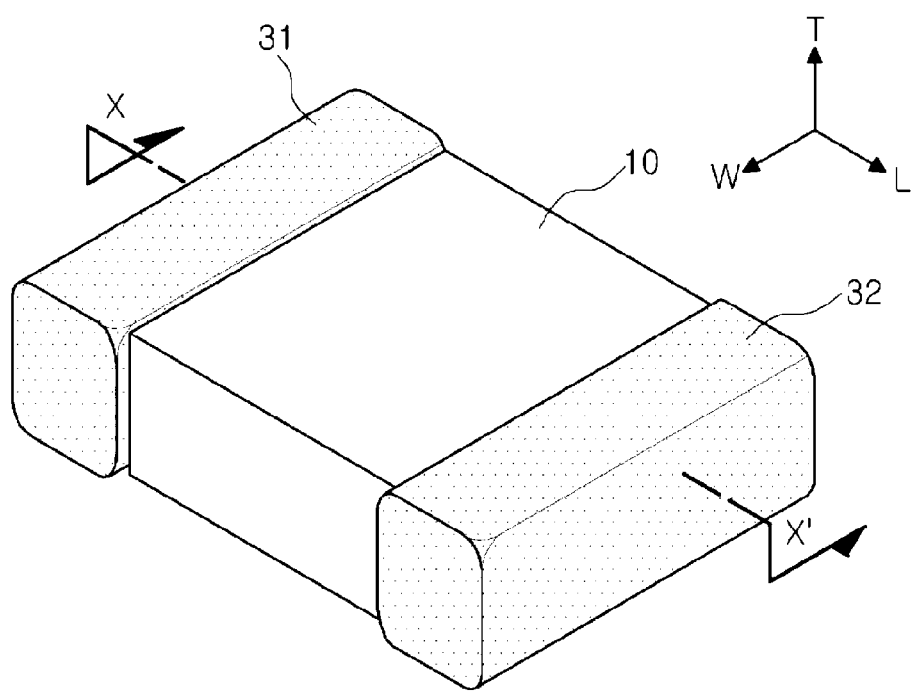
FIG. 1 is a perspective view showing a multilayer ceramic electronic part to be embedded in the board according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Multilayer Ceramic Electronic Part to be Embedded in Board

FIG. 1 is a perspective view showing a multilayer ceramic electronic part to be embedded in a board according to an exemplary embodiment of the present disclosure.

Figure 2:
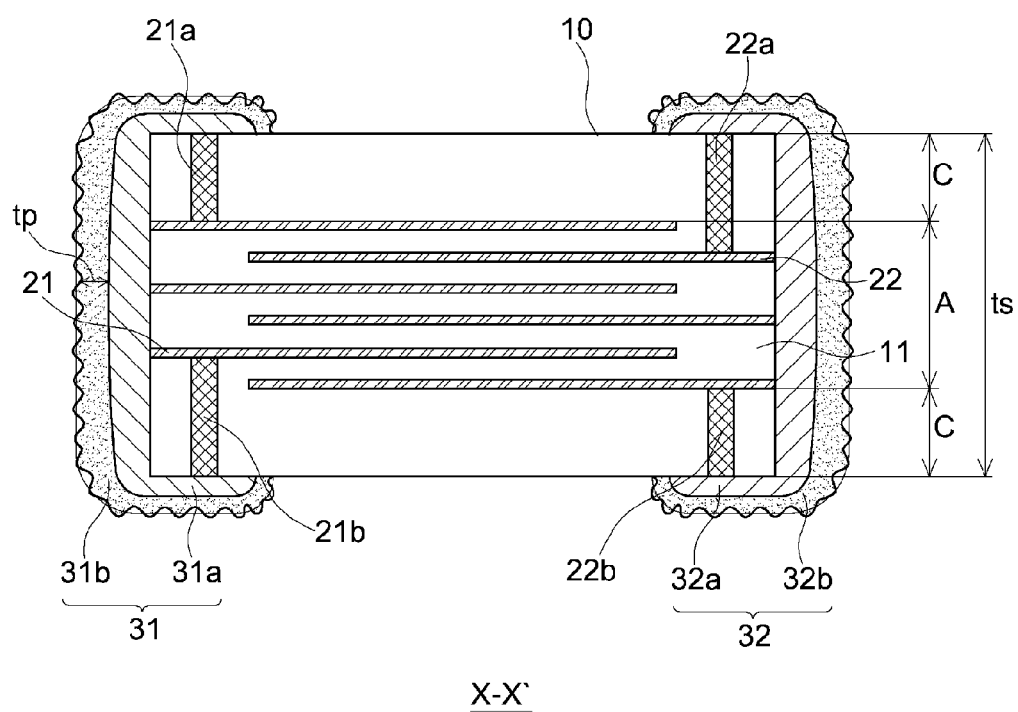
FIG. 2 is a cross-sectional view taken along line X-X' of FIG. 1, showing the multilayer ceramic electronic part to be embedded in the board according to the exemplary embodiment of the present disclosure.

FIG. 2 is a cross-sectional view taken along line X-X' of FIG. 1, showing the multilayer ceramic electronic part to be embedded in the board according to the exemplary embodiment of the present disclosure.

Referring to FIGS. 1 and 2, the multilayer ceramic electronic part to be embedded in the board according to the exemplary embodiment of the present disclosure may include: a ceramic body 10 including dielectric layers 11 and having first and second main surfaces facing each other, first and second side surfaces facing each other, and first and second end surfaces facing each other; an active layer including a plurality of first and second internal electrodes 21 and 22 alternately exposed through both end surfaces of the ceramic body 10, having the dielectric layer 11 therebetween, to thereby form capacitance; upper and lower cover layers formed on and below the active layer, respectively; and first and second external electrodes 31 and 32 formed in both ends of the ceramic body 10, wherein the first external electrode 31 includes a first base electrode 31a and a first terminal electrode 31b formed on the first base electrode 31a, the second external electrode includes a second base electrode 32a and a second terminal electrode 32b formed on the second base electrode 32a, the first internal electrode 21 positioned at an outermost position among the first and second internal electrodes 21 and 22 is connected to the first base electrode 31a by at least one first via 21a and 21b extended to at least one of the first and second main surfaces of the ceramic body 10, and the second internal electrode 22 positioned at the outermost position among the first and second internal electrodes 21 and 22 is connected to the second base electrode 32a by at least one second via 22a and 22b extended to at least one of the first and second main surfaces of the ceramic body 10.

Hereinafter, the multilayer ceramic electronic part according to the exemplary embodiment of the present disclosure will be described. In particular, a multilayer ceramic capacitor will be described. However, the present disclosure is not limited thereto.

In the multilayer ceramic capacitor according to the exemplary embodiment of the present disclosure, a "length direction" refers to an "L" direction of FIG. 1, a "width direction" refers to a "W" direction of FIG. 1, and a 'thickness direction" refers to a "T" direction of FIG. 1. Here, the "thickness direction" may be the same as a direction in which the dielectric layers are stacked, that is, a "stacked direction".

In the exemplary embodiment of the present disclosure, the ceramic body 10 may have a hexahedral shape as shown in drawings, but its shape is not particularly limited.

In the exemplary embodiment of the present disclosure, the ceramic body 10 may have the first and second main surfaces opposing each other, the first and second side surfaces opposing each other, and the first and second end surfaces opposing each other, wherein the first and second main surfaces may be referred to as upper and lower surfaces of the ceramic body 10.

The ceramic body 10 may have a thickness (ts) of 250 μm or less.

The ceramic body 10 is manufactured to have the thickness (ts) of 250 μm or less, which is appropriate for the multilayer ceramic capacitor to be embedded in a board.

In addition, the thickness (ts) of the ceramic body 10 may be a distance between the first and second main surfaces.

According to the exemplary embodiment of the present disclosure, a raw material forming the dielectric layer 11 is not particularly limited as long as sufficient capacitance may be obtained, and may be, for example, a barium titanate ($BaTiO_3$) powder.

In the material forming the dielectric layer 11, various ceramic additives, organic solvents, plasticizers, binders, dispersants, and the like, may be added to a powder such as a barium titanate ($BaTiO_3$) powder, or the like, according to an object of the present disclosure.

An average particle size of ceramic powder used in forming the dielectric layer 11 is not particularly limited. The average particle thereof may be adjusted, for example, to be 400 nm or less in order to achieve the object of the present disclosure.

The ceramic body 10 may be configured of an active layer A as a part contributing to forming capacitance in the capacitor and upper and lower cover layers C formed on and below the active layer as upper and lower margin parts, respectively.

The active layer A may be formed by repeatedly stacking a plurality of first and second internal electrodes 21 and 22, having the dielectric layer 11 therebetween.

The upper and lower cover layers C may have the same material and configuration as those of the dielectric layer 11, except for not including the internal electrode.

The upper and lower cover layers C may be formed by stacking a single dielectric layer or two or more dielectric layers on upper and lower surfaces of the active layer in upper and lower directions, respectively, and may serve to prevent damage to the internal electrodes caused by physical or chemical stress.

The first and second internal electrodes 21 and 22, which are a pair of electrodes having different polarities, may be formed on the dielectric layer 11 by printing a conductive paste including a conductive metal at a predetermined thickness.

In addition, the first and second internal electrodes 21 and 22 may be alternately exposed through both end surfaces in a stacked direction of the dielectric layer 11, and be electrically insulated from each other by the dielectric layer 11 disposed therebetween.

The first and second internal electrodes 21 and 22 may be electrically connected to the first and second external electrodes 31 and 32, respectively, through a portion of both end surfaces of the ceramic body 10 in which the first and second internal electrodes 21 and 22 are alternately exposed.

Therefore, in the case in which voltage is applied to the first and second external electrodes 31 and 32, electric charges are accumulated between the first and second internal electrodes 21 and 22 opposing each other. Here, capacitance of the multilayer ceramic capacitor is proportional to an area of a region in which the first and second internal electrodes 21 and 22 overlap.

The conductive metal included in the conductive paste forming the first and second internal electrodes 21 and 22 may be nickel (Ni), copper (Cu), palladium (Pd), or alloys thereof, but the present disclosure is not limited thereto.

Further, a method of printing the conductive paste may include a screen printing method, a gravure printing method, and the like, but the present disclosure is not limited thereto.

According to the exemplary embodiment of the present disclosure, the first and second external electrodes 31 and 32 may be formed on both ends of the ceramic body 10.

The first external electrode 31 may include the first base electrode 31a electrically connected to the first internal electrode 21 and the first terminal electrode 31b formed on the first base electrode 31a.

The second external electrode 32 may include the second base electrode 32a electrically connected to the second internal electrode 22 and the second terminal electrode 32b formed on the second base electrode 32a.

Hereinafter, structures of the first and second external electrodes 31 and 32 will be described in detail.

The first and second base electrodes 31a and 32a may include a first conductive metal and a glass.

The first and second external electrodes 31 and 32 may be formed on both end surfaces of the ceramic body 10 in order to form capacitance, and the first and second base electrodes 31a and 32a included in the first and second external electrodes 31 and 32 may be electrically connected to the first and second internal electrodes 21 and 22.

The first and second base electrodes 31a and 32a may be formed of a same conductive material as that of the first and second internal electrodes 21 and 22, and for example, may be formed of at least one first conductive metal selected from a group consisting of copper (Cu), silver (Ag), nickel (Ni), and alloys thereof. However, the present disclosure is not limited thereto.

The first and second base electrodes 31a and 32a may be formed by applying the conductive paste prepared by adding glass frit to a first conductive metal powder and sintering.

According to the exemplary embodiment of the present disclosure, the first and second external electrodes 31 and 32 may include the first and second terminal electrodes 31b and 32b formed on the first and second base electrodes 31a and 32a.

The first and second terminal electrodes 31b and 32b may be formed of a second conductive metal.

The second conductive metal may be copper (Cu), but is not particularly limited.

In general, since the multilayer ceramic capacitor is mounted on the printed circuit board, a nickel/tin plating layer is formed on the external electrode.

However, the multilayer ceramic capacitor according to the exemplary embodiment of the present disclosure is to be embedded in the printed circuit board and may not be mounted on the board. The first and second external electrodes 31 and 32 of the multilayer ceramic capacitor and a circuit of the board may be electrically connected through a via formed of a copper (Cu) material.

Therefore, according to the exemplary embodiment of the present disclosure, the first and second terminal electrodes 31b and 32b may be formed of copper (Cu) having high electrical connectivity with copper (Cu), the material of the via in the board.

Meanwhile, the first base electrode 31a and the second base electrode 32a are mainly formed of copper (Cu), but includes a glass, such that at the time of laser processing used to form the via in the board, an element included in the glass absorbs the laser, whereby a processing depth of the via may not be adjusted.

Due to the reason described above, the first and second terminal electrodes 31b and 32b of the multilayer ceramic electronic part to be embedded in the board may be formed of copper (Cu).

A method of forming the first and second terminal electrodes 31b and 32b is not particularly limited, but for example, may include plating.

Therefore, since the first and second terminal electrodes 31b and 32b are formed of only copper (Cu) and do not include a glass frit after sintering, the above-described problem that the processing depth of the via cannot be adjusted may not occur as there is no glass to absorb the laser.

Meanwhile, according to the exemplary embodiment of the present disclosure, the first internal electrode 21 positioned at the outermost position among the first and second internal electrodes 21 and 22 may be connected to the first base electrode 31a by at least one first via 21a and 21b extended to at least one of the first and second main surfaces of the ceramic body 10, and the second internal electrode 22 positioned at the outermost position among the first and second internal electrodes 21 and 22 may be connected to the second base electrode 32a by at least one second via 22a and 22b extended to at least one of the first and second main surfaces of the ceramic body 10.

In general, since a copper (Cu) plating layer is separately formed on the external electrode of the multilayer ceramic electronic component to be embedded in the board, the internal electrodes may be damaged by infiltration of the plating solution.

In order to prevent the above-described problem, the multilayer ceramic electronic part to be embedded in the board has thick upper and lower cover layers to prevent the internal electrodes from being damaged by the infiltration of the plating solution.

However, in the case in which the upper and lower cover layers are thick, a current path in the multilayer ceramic electronic part to be embedded in the board is elongated, such that it is not easy to decrease an equivalent series inductance (ESL).

However, according to the exemplary embodiment of the present disclosure, the first internal electrode 21 positioned at the outermost position among the first and second internal electrodes 21 and 22 may be connected to the first base electrode 31a by at least one first via 21a and 21b extended to at least one of the first and second main surfaces of the ceramic body 10, and the second internal electrode 22 positioned at the outermost position among the first and second internal electrodes may be connected to the second base electrode 32a by at least one second via 22a and 22b extended to at least one of the first and second main surfaces of the ceramic body 10, such that the equivalent series inductance (ESL) may be decreased.

More specifically, the current path in the multilayer ceramic electronic part to be embedded in the board may be shortened to decrease the ESL.

In a general multilayer ceramic electronic part to be embedded in a board, a current is moved to the first internal electrode through the first end surface of the ceramic body by a voltage applied to the first external electrode, and the current path of the second internal electrode and the second external electrode is formed through the second end surface of the ceramic body.

However, in the case in which the first internal electrode 21 and the second internal electrode 22 positioned at the outermost position among the first and second internal electrodes are connected to the first and second base electrodes 31a and 32a by the first and second vias 21a, 21b, 22a, and 22b extended to at least one of the first and second main surfaces of the ceramic body as described in the exemplary embodiment of the present disclosure, the current path may be shortened.

That is, in the case in which the current flows through the first or the second main surface of the ceramic body according to the exemplary embodiment of the present disclosure, as compared to the current path in which the current flows through both end surfaces of the ceramic body, the current path may be shortened.

The current path may be shortened as described above, such that the ESL of the multilayer ceramic electronic part to be embedded in the board may be decreased.

Meanwhile, when the thickness of the first and second terminal electrodes 31b and 32b is tp, the following equation: tp≥5 μm may be satisfied.

The thickness tp of the first and second terminal electrodes 31b and 32b may satisfy the following equation: tp≥5 μm, but the present disclosure is not limited thereto, and the thickness tp of the first and second terminal electrodes 31b and 32b may be 15 μm or less.

By adjusting the thickness tp of the first and second terminal electrodes 31b and 32b to be 15 μm or less and satisfy the following equation: tp≥5 μm, the multilayer ceramic capacitor with excellent via processing in the board and outstanding reliability may be achieved.

In the case in which the thickness tp of the first and second terminal electrodes 31b and 32b is less than 5 μm, at the time of embedding the multilayer ceramic electronic part in the printed circuit board and processing the conductive via hole, a defect in which the conductive via hole is connected to the ceramic body 10 may occur, as described below.

In the case in which the thickness tp of the first and second terminal electrodes 31b and 32b is more than 15 µm, a crack may occur in the ceramic body 10 due to stress of the first and second terminal electrodes 31b and 32b.

Meanwhile, referring to FIG. 2, in the multilayer ceramic electronic part according to the exemplary embodiment of the present disclosure, when a surface roughness of the first and second terminal electrodes 31b and 32b is Ra and the thickness of the first and second terminal electrodes 31b and 32b is tp, the following equation: 200 nm≤Ra≤tp may be satisfied.

The surface roughness Ra of the first and second terminal electrodes 31b and 32b may be adjusted to satisfy the following equation: 200 nm≤Ra≤tp, such that delamination between the multilayer ceramic electronic part and the board may be alleviated and cracks may be prevented.

The surface roughness refers to a degree of a fine unevenness formed on a surface at the time of processing a metal surface.

The surface roughness is formed by tools used in the processing, propriety of the processing method, scratch on the surface, rust, and the like. In indicating the degree of roughness, the surface is cut at a plane perpendicular to the surface and the cut cross section forms a certain curve, wherein a height from the lowest point to the highest point of the curve is referred to as a center line average roughness, represented by Ra.

In the exemplary embodiment of the present disclosure, the center line average roughness of the first and second terminal electrodes 31b and 32b is defined as Ra.

Specifically, the center line average roughness Ra of the first and second terminal electrodes 31b and 32b may be calculated by drawing a virtual center line with respect to the roughness formed on one surface of the first and second terminal electrodes 31b and 32b.

Next, each distance with respect to the virtual centerline of the roughness (for example, $r_1$, $r_2$, $r_3$, ... and $r_{13}$) may be measured, and the center line average roughness Ra of the first and second terminal electrodes 31b and 32b may be calculated by calculating an average value of each distance as described in the following equation:

$$R_a = \frac{|r_1| + |r_2| + |r_3| + \dots |r_n|}{n}.$$

By adjusting the center line average roughness Ra of the first and second terminal electrodes 31b and 32b to satisfy the following equation: 200 nm≤Ra≤tp, the multilayer ceramic electronic part having excellent withstand voltage, improved adhesion between the multilayer ceramic electronic part and the board, and excellent reliability may be achieved.

In the case in which the surface roughness of the first and second terminal electrodes 31b and 32b is less than 200 nm, delamination between the multilayer ceramic electronic component and the board may occur.

Meanwhile, in the case in which the surface roughness of the first and second terminal electrodes 31b and 32b exceeds the thickness tp of the first and second terminal electrodes 31b and 32b, a crack may occur.

FIGS. 3 through 7 are cross-sectional views taken along line X-X' of FIG. 1, showing the multilayer ceramic electronic parts to be embedded in the board according to various exemplary embodiments of the present disclosure.

As described above, the first internal electrode 21 positioned at the outermost position among the first and second internal electrodes 21 and 22 may be connected to the first base electrode 31a by at least one first via 21a and 21b extended to at least one of the first and second main surfaces of the ceramic body 10, the second internal electrode 22 positioned at the outermost position among the first and second internal electrodes 21 and 22 may be connected to the second base electrode 32a by at least one second via 22a and 22b extended to at least one of the first and second main surfaces of the ceramic body 10, such that the equivalent series inductance (ESL) may be decreased and the first and second vias may have various shapes.

Figure 3:
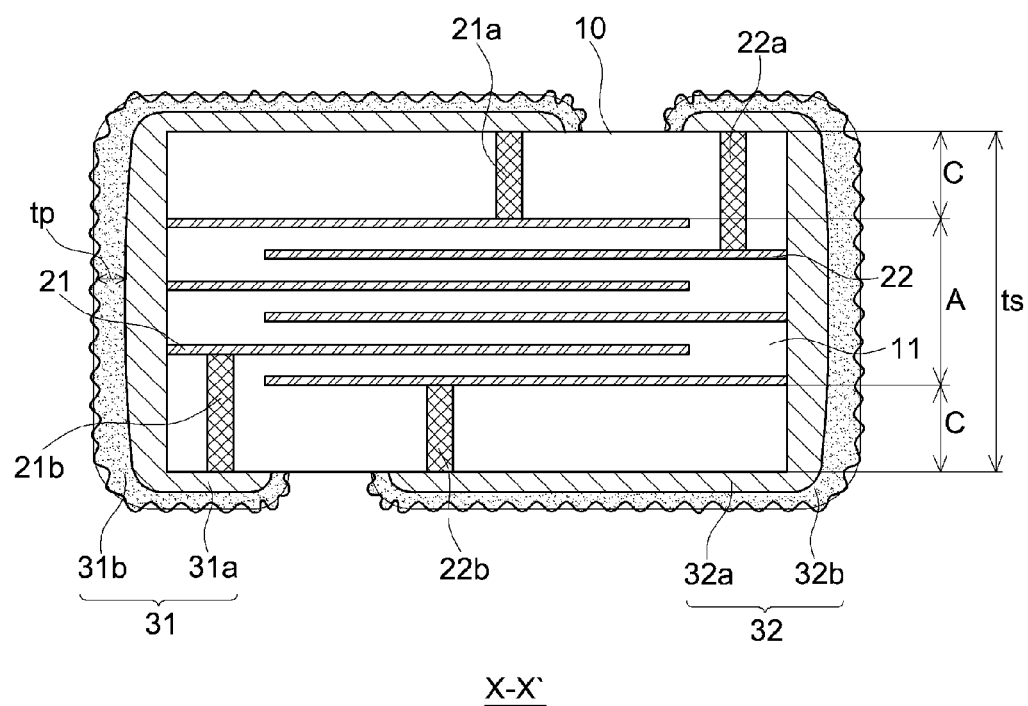
FIGS. 3 through 7 are cross-sectional views taken along line X-X' of FIG. 1, showing the multilayer ceramic electronic parts to be embedded in the board according to various exemplary embodiments of the present disclosure.

Referring to FIG. 3, a width of the first external electrode 31 formed on the first and second main surfaces may be different from that of the second external electrode 32 formed thereon, further shortening an interval between the first vias 21a and 21b and the second vias 22a and 22b formed in the ceramic body 10 such that the ESL may be effectively decreased.

Figure 4:
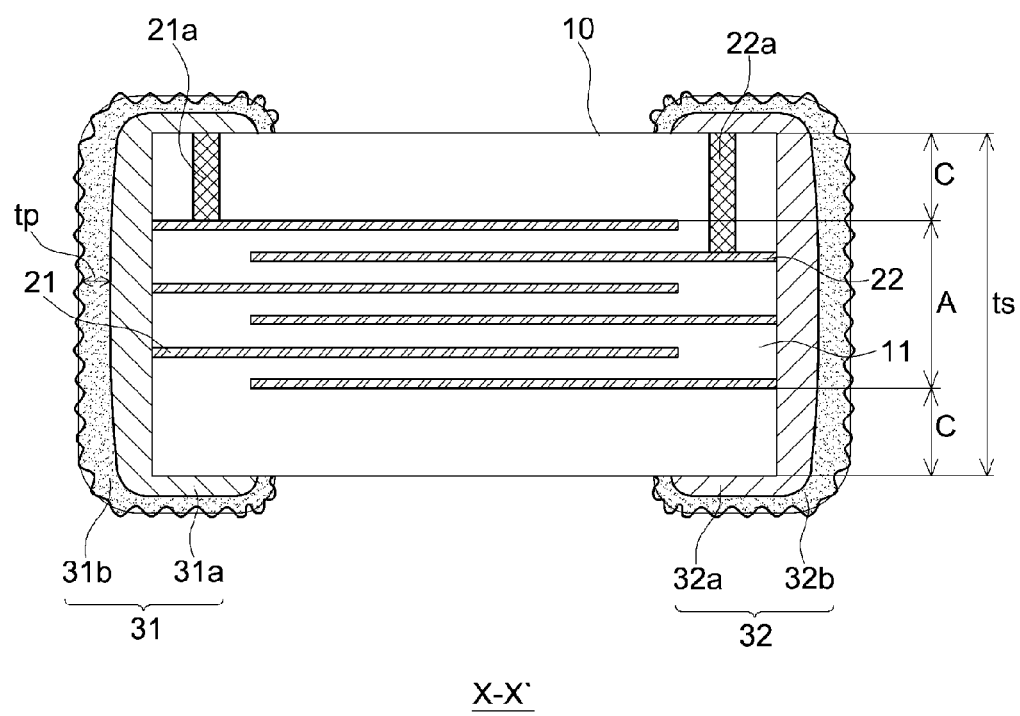

Referring to FIG. 4, the first and second vias 21a and 22a may be extended only to the first main surface depending on a position at which the conductive via hole is formed in the printed circuit board.

Figure 5:
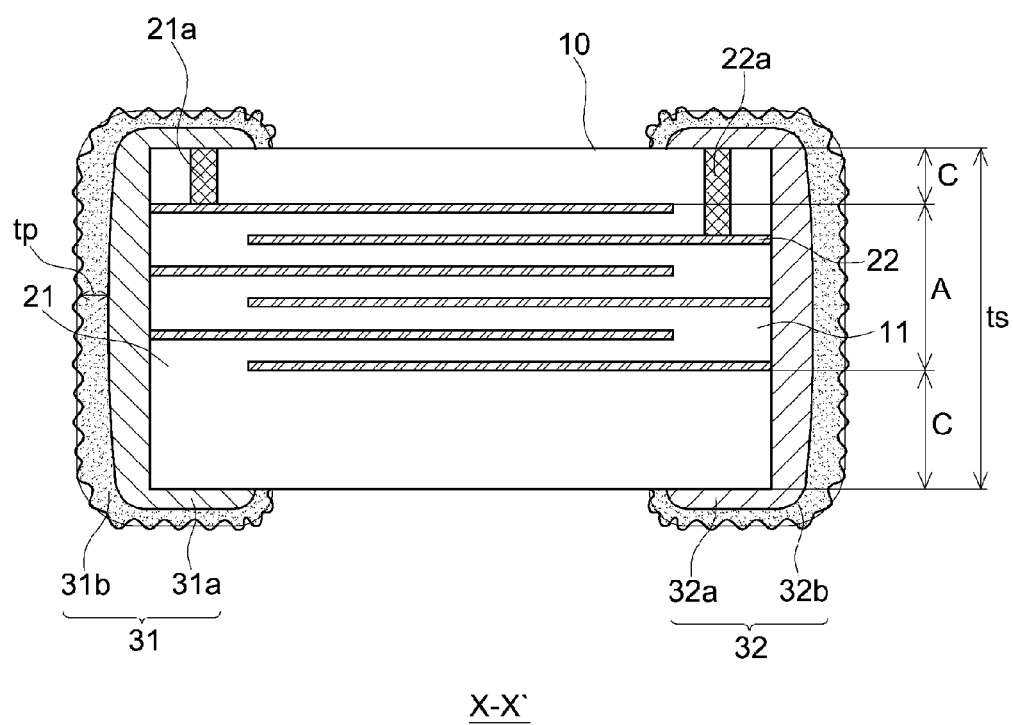

Referring to FIG. 5, the first and second vias 21a and 22a may be extended only to the first main surface, and the lower cover layer may be thicker the upper cover layer, such that the current path in the multilayer ceramic electronic part to be embedded in the board may be further shortened to effectively decrease the ESL.

Figure 6:
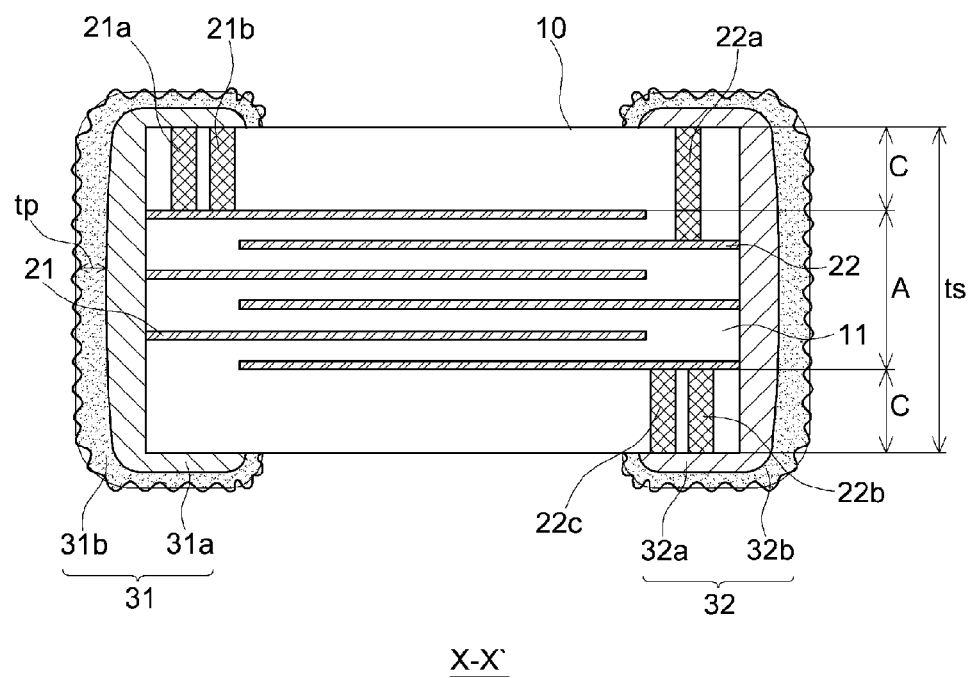

Referring to FIG. 6, the first vias 21a and 21b may be extended only to the first main surface, and among the second vias 22a, 22b, and 22c, the second via 22a may be extended to the first main surface and the second vias 22b and 22c may be extended to the second main surface.

Figure 7:
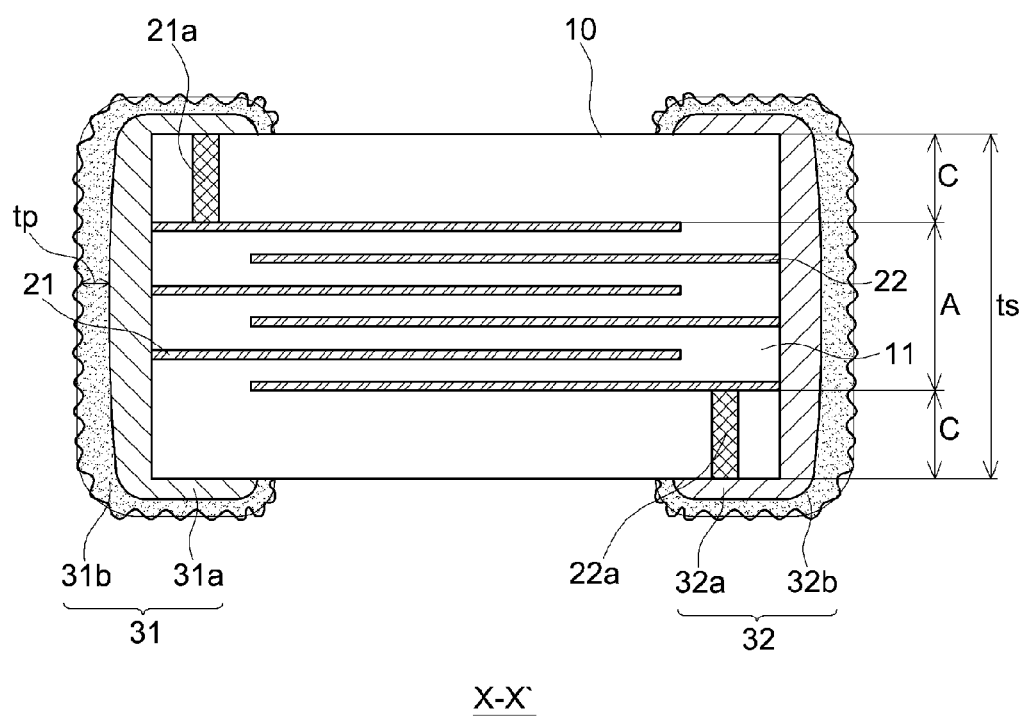

Referring to FIG. 7, the first vias 21a and 21b may be extended only to the first main surface, and the second via 22a may be extended only to the second main surface.

Hereinafter, a method of manufacturing the multilayer ceramic electronic part to be embedded in the board according to the exemplary embodiment of the present disclosure will be described, but the present disclosure is not limited thereto.

In the method of manufacturing the multilayer ceramic electronic part to be embedded in the board according to the exemplary embodiment of the present disclosure, first, a slurry containing a powder such as a barium titanate (BaTiO$_3$) powder, or the like, may be applied and dried onto a carrier film to prepare a plurality of ceramic green sheets, thereby forming a dielectric layer.

The slurry may be prepared by mixing ceramic powder, a binder, and a solvent, and be used to manufacture a sheet type ceramic green sheet having a thickness of several µm by a doctor blade method.

Then, a conductive paste for an internal electrode containing 40 to 50 parts by weight of nickel powder having an average grain size of 0.1 µm to 0.2 µm may be prepared.

The ceramic body 10 may be manufactured by applying the conductive paste for an internal electrode onto the green sheet by a screen printing method to form the internal electrode, and stacking 400 to 500 layers of the internal electrodes.

In the multilayer ceramic capacitor according to the exemplary embodiment of the present disclosure, the first and second internal electrodes 21 and 22 may each be exposed to both end surfaces of the ceramic body 10.

The first and second vias may be formed by drilling the via hole from the upper or lower surface of the ceramic body 10 to the internal electrode positioned at the outermost position among the first and second internal electrodes and filling the via hole with the same nickel paste as the internal electrodes.

Then, the first and second base electrodes including the first conductive metal and the glass may be formed on ends of the ceramic body 10, wherein the first via and the second via may be connected to each other.

The first conductive metal is not particularly limited, but may be at least one selected from a group consisting of copper (Cu), silver (Ag), nickel (Ni), and alloys thereof.

The glass is not particularly limited, but may have a same composition as a glass used in manufacturing general external electrodes of the multilayer ceramic capacitor.

The first and second base electrodes may be formed on the ends of the ceramic body to thereby be electrically connected to the first and second internal electrodes, respectively.

Then, a plating layer formed of the second conductive metal may be formed on the first and second base electrodes.

The second conductive metal is not particularly limited, but may be copper (Cu).

The plating layer may be formed of first and second terminal electrodes.

Parts which are the same as the features of the multilayer ceramic electronic part to be embedded in the board according to the exemplary embodiment of the present disclosure will be omitted.

Hereafter, the present disclosure will be described in detail with reference to Inventive Example, but it is not limited thereto.

In order to confirm whether or not a via processing defect depending on a thickness of the first and second terminal electrodes 31b and 32b occurs and to check a frequency at which an adhesion surface is delaminated depending on the surface roughness of the first and second terminal electrodes 31b and 32b in the multilayer ceramic electronic part to be embedded in the board according to the exemplary embodiment of the present disclosure, the board having the multilayer ceramic electronic part to be embedded in the board was left in conventional conditions of a chip component for a mobile phone mother board, that is, at a temperature of 85° C. and a relative humidity of 85%, for thirty minutes, and each examination was performed.

The following Table 1 shows whether or not the via processing defect depending on the thickness of the first and second terminal electrodes 31b and 32b occurred.

TABLE 1

| Thickness (μm) of First and Second Terminal Electrodes | Determination |
|---|---|
| Less than 1 | X |
| 1~2 | X |
| 2~3 | X |
| 3~4 | Δ |
| 4~5 | ○ |
| 5~6 | ◉ |
| 6 or more | ◉ |

X: Defective Rate of 50% or higher
Δ: Defective Rate of 10% to 50%
○: Defective Rate of 0.01% to 10%
◉: Defective Rate lower than 0.01%

It may be seen from Table 1 above that in the case in which the first and second terminal electrodes 31b and 32b have the thickness of 5 μm or more, the multilayer ceramic capacitor with excellent via processing in the board and excellent reliability may be achieved.

Meanwhile, in the case in which the first and second terminal electrodes 31b and 32b have the thickness of less than 5 μm, defect may occur at the time of via processing in the board.

The following Table 2 shows the frequency at which the adhesion surface is delaminated depending on a surface roughness of the first and second terminal electrodes 31b and 32b.

TABLE 2

| Surface Roughness (nm) of First and Second Terminal Electrodes | Determination |
|---|---|
| Less than 50 | X |
| 50~100 | X |
| 100~150 | Δ |
| 150~200 | ○ |
| 200~250 | ◉ |
| 250 or more | ◉ |

X: Defective Rate of 50% or higher
Δ: Defective Rate of 10% to 50%
○: Defective Rate of 0.01% to 10%
◉: Defective Rate lower than 0.01%

It may be seen from Table 2 above that in the case in which the first and second terminal electrodes 31b and 32b have the surface roughness of 200 nm or more, the frequency at which the adhesion surface is delaminated is low, such that the multilayer ceramic capacitor with excellent reliability may be achieved.

Meanwhile, it may be seen that in the case in which the first and second terminal electrodes 31b and 32b have the surface roughness less than 200 nm, the frequency at which the adhesion surface is delaminated is increased, such that the multilayer ceramic capacitor may have a problem in reliability.

Figure 8:
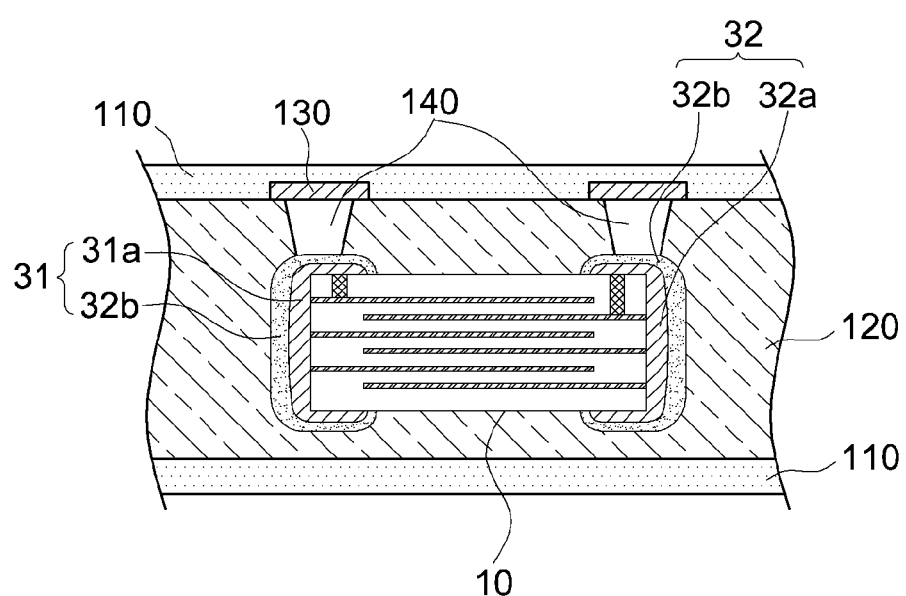
FIG. 8 is a cross-sectional view showing a printed circuit board having a multilayer ceramic electronic part to be embedded in the board according to an exemplary embodiment of the present disclosure.

Printed Circuit Board Having Multilayer Ceramic Electronic Part Embedded Therein FIG. 8 is a cross-sectional view showing a printed circuit board having a multilayer ceramic electronic part embedded therein according to an exemplary embodiment of the present disclosure.

Referring to FIG. 8, the printed circuit board 100 having the multilayer ceramic electronic part embedded therein according to the exemplary embodiment of the present disclosure may include: an insulating board 110; and the multilayer ceramic electronic part to be embedded in the board including a ceramic body 10 including dielectric layers 11 and having first and second main surfaces opposing each other, first and second side surfaces opposing each other, and first and second end surfaces opposing each other; an active layer including a plurality of first and second internal electrodes 21 and 22 alternately exposed through both end surfaces of the ceramic body 10, having the dielectric layers 11 therebetween, to thereby form capacitance; upper and lower cover layers formed on and below the active layer, respectively; and first and second external electrodes 31 and 32 formed on both ends of the ceramic body 10, wherein the first external electrode 31 includes a first base electrode 31a and a first terminal electrode 31b formed on the first base electrode 31a, the second external electrode includes a second base electrode 32a and a second terminal electrode 32b formed on the second base electrode 32a, the first internal electrode 21 positioned at the outermost position among the first and second internal electrodes 21 and 22 is connected to the first base electrode 31a by at least one first via 21a and 21b extended to at least one of the first and second main surfaces of the ceramic body 10, and the second internal electrode 22 positioned at the outermost position among the first and second internal electrodes 21 and 22 is connected to the second base electrode 32a by at least one second via 22a and 22b extended to at least one of the first and second main surfaces of the ceramic body 10.

The insulating substrate 110 includes an insulating layer 120 therein, and as shown in FIG. 8, may include conductive patterns 130 and conductive via holes 140 configuring various shapes of interlayer circuits, as needed. The insulating substrate 110 may be the printed circuit board 100 including the multilayer ceramic electronic part embedded therein.

After the multilayer ceramic electronic part is inserted into the printed circuit board 100, various severe conditions in subsequent processes such as heat treatment, and the like, of the printed circuit board 100 may be applied to the multilayer ceramic electronic component.

In particular, shrinkage and expansion of the printed circuit board 100 in the heat treatment process may be directly delivered to the multilayer ceramic electronic part inserted in the printed circuit board 100, thereby applying stress on the adhesion surface between the multilayer ceramic electronic part and the printed circuit board 100.

In the case in which the stress applied on the adhesion surface between the multilayer ceramic electronic part and the printed circuit board 100 is higher than adhesion strength thereof, a delamination defect in which the adhesion surface is detached may occur.

The adhesion strength between the multilayer ceramic electronic part and the printed circuit board 100 is proportional to an electrochemical bonding strength between the multilayer ceramic electronic part and the printed circuit board 100 and an effective surface area of the adhesion surface, wherein in order to improve the effective surface area of the adhesion surface between the multilayer ceramic electronic part and the printed circuit board 100, the surface roughness of the multilayer ceramic electronic part may be adjusted to alleviate the delamination phenomenon between the multilayer ceramic electronic part and the printed circuit board 100.

In addition, the frequency at which the adhesion surface with the printed circuit board 100 is delaminated depending on the surface roughness of the multilayer ceramic electronic part embedded in the printed circuit board 100 may be checked.

Since other descriptions are the same as the above-described features of the printed circuit board having the multilayer ceramic electronic part embedded therein according to the exemplary embodiment of the present disclosure, the overlapped descriptions thereof will be omitted.

As set forth above, according to exemplary embodiments of the present disclosure, a multilayer ceramic electronic part to be embedded in a board has vias formed therein to connect internal electrodes and external electrodes through the vias, such that a current path may be shortened to decrease equivalent series inductance (ESL).

In addition, according to exemplary embodiments of the present disclosure, a low inductance may be achieved and a surface roughness of a plating layer may be adjusted to improve adhesion properties, alleviating delamination phenomenon between the multilayer ceramic electronic part and the board.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic electronic part to be embedded in a board, the multilayer ceramic electronic part comprising:
a ceramic body including dielectric layers and having first and second main surfaces opposing each other, first and second side surfaces opposing each other, and first and second end surfaces opposing each other;
an active layer including a plurality of first and second internal electrodes alternately exposed through the first and second end surfaces of the ceramic body, having the dielectric layers therebetween, to thereby form capacitance;
upper and lower cover layers disposed on and below the active layer, respectively; and
first and second external electrodes formed on the first and second end surfaces of the ceramic body,
wherein the first external electrode includes a first base electrode and a first terminal electrode formed on the first base electrode,
the second external electrode includes a second base electrode and a second terminal electrode formed on the second base electrode,
a first internal electrode at an outermost position among the first and second internal electrodes is connected to the first base electrode by at least one first via extended to the first main surface of the ceramic body,
a second internal electrode at an outermost position among the first and second internal electrodes is connected to the second base electrode by at least one second via extended to at least one of the first and second main surfaces of the ceramic body,
the first base electrode and the second base electrode include copper (Cu) and glass, and the first and second terminal electrodes are formed of copper (Cu) having high electrical connectivity with copper (Cu), the material of a via in the board,
the at least one first via does not penetrate through all of the first internal electrodes electrically connected to the first external electrode which the at least one first via is electrically connected to, and the at least one second via does not penetrate through all of the second internal electrodes electrically connected to the second external electrode which the at least one second via is electrically connected to,
the first terminal electrode is disposed on the first end surface of the ceramic body in a length direction, as well as on the first and second main surfaces of the ceramic body, and the second terminal electrode is disposed on the second end surface of the ceramic body in the length direction, as well as on the first and second main surfaces of the ceramic body,
a width of the first external electrode formed on the first main surface is greater than that of the second external electrode formed on the first main surface, and a width of the first external electrode formed on the second main surface is less than that of the second external electrode formed on the second main surface, and
a distance from the at least one first via extending to the first main surface to the first end surface is greater than the width of the first external electrode formed on the second main surface.

2. The multilayer ceramic electronic part of claim 1, wherein the at least one second via extends to the first main surface.

3. The multilayer ceramic electronic part of claim 1, wherein the lower cover layer is thicker than the upper cover layer.

4. The multilayer ceramic electronic part of claim 1, wherein the the at least one second via extends to the second main surface, and a distance from the at least one second via to the second end surface is greater than the width of the second external electrode formed on the first main surface.

5. The multilayer ceramic electronic part of claim 1, wherein the first and second terminal electrodes have a thickness of 5 µm or greater.

6. The multilayer ceramic electronic part of claim 1, wherein when a surface roughness of the first and second terminal electrodes is Ra and a thickness of the first and second terminal electrodes is tp, 200 nm≤Ra≤tp is satisfied.

7. The multilayer ceramic electronic part of claim 1, wherein the first and second terminal electrodes are formed by a plating process.

8. The multilayer ceramic electronic part of claim 1, wherein the ceramic body has a thickness of 250 µm or less.

9. A printed circuit board having a multilayer ceramic electronic part embedded therein, the printed circuit board comprising:
   an insulating substrate; and
   the multilayer ceramic electronic part embedded in the printed circuit board including a ceramic body including dielectric layers and having first and second main surfaces opposing each other, first and second side surfaces opposing each other, and first and second end surfaces opposing each other;
   an active layer including a plurality of first and second internal electrodes alternately exposed through the first and second end surfaces of the ceramic body, having the dielectric layers therebetween, to thereby form capacitance;
   upper and lower cover layers disposed on and below the active layer, respectively; and
   first and second external electrodes formed on the first and second end surfaces of the ceramic body,
   wherein the first external electrode includes a first base electrode and a first terminal electrode formed on the first base electrode,
   the second external electrode includes a second base electrode and a second terminal electrode formed on the second base electrode,
   a first internal electrode at an outermost position among the first and second internal electrodes is connected to the first base electrode by at least one first via extended to the first main surface of the ceramic body,
   a second internal electrode at an outermost position among the first and second internal electrodes is connected to the second base electrode by at least one second via extended to at least one of the first and second main surfaces of the ceramic body,
   the first base electrode and the second base electrode include copper (Cu) and glass, and the first and second terminal electrodes are formed of copper (Cu) having high electrical connectivity with copper (Cu), the material of a via in the printed circuit board,
   the at least one first via does not penetrate through all of the first internal electrodes electrically connected to the first external electrode which the at least one first via is electrically connected to, and the at least one second via does not penetrate through all of the second internal electrodes electrically connected to the second external electrode which the at least one second via is electrically connected to,
   the first terminal electrode is disposed on the first end surface of the ceramic body in a length direction, as well as on the first and second main surfaces of the ceramic body, and the second terminal electrode is disposed on the second end surface of the ceramic body in the length direction, as well as on the first and second main surfaces of the ceramic body,
   a width of the first external electrode formed on the first main surface is greater than that of the second external electrode formed on the first main surface, and a width of the first external electrode formed on the second main surface is less than that of the second external electrode formed on the second main surface, and
   a distance from the at least one first via extending to the first main surface to the first end surface is greater than the width of the first external electrode formed on the second main surface.

10. The printed circuit board of claim 9, wherein the at least second extends to the first main surface.

11. The printed circuit board of claim 9, wherein the lower cover layer is thicker than the upper cover layer.

12. The printed circuit board of claim 9, wherein the at least one second via to the second main surface, and a distance from the at least one second via to the second end surface is greater than the width of the second external electrode formed on the first main surface.

13. The printed circuit board of claim 9, wherein the first and second terminal electrodes have a thickness of 5 µm or greater.

14. The printed circuit board of claim 9, wherein when a surface roughness of the first and second terminal electrodes is Ra and a thickness of the first and second terminal electrodes is tp, 200 nm≤Ra≤tp is satisfied.

15. The printed circuit board of claim 9, wherein the first and second terminal electrodes are formed by a plating process.

16. The printed circuit board of claim 9, wherein the ceramic body has a thickness of 250 µm or less.

\* \* \* \* \*